United States Patent [19]
Lebby et al.

[11] Patent Number: 5,498,883
[45] Date of Patent: Mar. 12, 1996

[54] SUPERLUMINESCENT EDGE EMITTING DEVICE WITH APPARENT VERTICAL LIGHT EMISSION AND METHOD OF MAKING

[75] Inventors: Michael S. Lebby, Chandler; Donald E. Ackley, Paradise Valley, both of Ariz.

[73] Assignee: Motorola, Inc., Schaumburg, Ill.

[21] Appl. No.: 317,110

[22] Filed: Oct. 3, 1994

Related U.S. Application Data

[63] Continuation of Ser. No. 925,053, Aug. 5, 1992, abandoned.
[51] Int. Cl.⁶ .......................... H01L 33/00; H01L 29/78
[52] U.S. Cl. .................................. 257/95; 257/98
[58] Field of Search ............................ 257/95, 98

[56] References Cited

U.S. PATENT DOCUMENTS

| | | | |
|---|---|---|---|
| 3,443,140 | 5/1969 | Ing, Jr. et al. | 257/98 |
| 3,821,775 | 6/1974 | Biard | 257/98 |
| 3,883,772 | 5/1975 | Wako et al. | 257/98 |
| 4,634,928 | 1/1987 | Figueroa et al. | |
| 4,636,821 | 1/1987 | Yanase et al. | |
| 4,821,276 | 4/1989 | Alphonse et al. | |
| 4,872,180 | 10/1989 | Rideout | |
| 5,001,609 | 3/1991 | Gardner et al. | 257/98 |
| 5,003,357 | 3/1991 | Kim et al. | 257/98 |
| 5,034,092 | 7/1991 | Lebby et al. | |
| 5,055,892 | 10/1991 | Gardner et al. | 257/98 |
| 5,116,461 | 5/1992 | Lebby et al. | |

FOREIGN PATENT DOCUMENTS

| | | |
|---|---|---|
| 2649537 | 11/1991 | France . |
| 63-73572 | 4/1988 | Japan ............................ 257/55 |
| 8503809 | 8/1985 | WIPO . |

OTHER PUBLICATIONS

"Handbook on Semiconductors," vol. 4, Chapter 7, pp. 708–715.

G. A. Alphonse et al., "Low Spectral Modulation High–Power Output From a New AlGaAs Superluminescent Diode/Optical Amplifier Structure," Applied Physics Letters, vol. 55 No. 22, Nov. 1989, pp. 2289–2291.

"Pillbox Quantum Well Light–Emitting Diode," IBM Technical Disclosure Bulletin, vol. 33, No. 1A, Jun. 1990, New York, U.S., pp. 403–404.

E. F. Schubert et al., "Resonant Cavity Light–Emitting Diode," Applied Physics Letters, vol. 60, No. 8, Feb. 22, 1992, New York, pp. 921–923.

Primary Examiner—Stephen D. Meier
Attorney, Agent, or Firm—Miriam Jackson

[57] ABSTRACT

A superluminescent edge emitting device is fabricated to have apparent vertical light emission. The superluminescent device is comprised of a semiconductor supporting structure having a major surface. A light emitting portion is formed above a first portion of the major surface, wherein the light emitting portion is configured in a substantially circular shape to suppress lasing and has sidewalls, and wherein light is emitted from the sidewalls of the light emitting portion. An non-emitting portion is formed above a second portion of the major surface and adjacent to the light emitting portion, wherein the non-emitting portion has sidewalls, and wherein the sidewalls of the light emitting portion and the sidewalls of the non-emitting portion are configured to direct the light emitted from the light emitting portion substantially perpendicular to the major surface.

25 Claims, 2 Drawing Sheets

SUPERLUMINESCENT EDGE EMITTING DEVICE WITH APPARENT VERTICAL LIGHT EMISSION AND METHOD OF MAKING

This application is a continuation of prior application Ser. No. 07/925,053, filed Aug. 5, 1992 now abandoned.

BACKGROUND OF THE INVENTION

The present invention relates, in general, to semiconductor devices, and more particularly to superluminescent light emitting devices (LEDs).

Superluminescent LEDs combine high efficiency with a broad spectral bandwidth. These characteristics are important for achieving high performance in applications such as a light source for fiber-optic gyroscopes. Another application for such devices is in a display matrix in which light from several hundred devices is combined to form an image. LEDs which operate in the lasing mode produce an undesirable "speckle" effect in an image due to coherent wave interference. The broad spectral bandwidth of a superluminescent LEDs precludes coherent wave interference effects.

In the past, superluminescent LEDs have been edge emitting devices where the light is emitted parallel to the surface of the semiconductor substrate in which the superluminescent LEDs are fabricated. However, production of light through the top surface of a light emitting device or perpendicular to the semiconductor substrate surface is highly desirable. Superluminescent LEDs which emit light perpendicular to the substrate surface may be integrated with devices having other functions on a single integrated circuit chip. Also, large arrays of similar such devices may be fabricated on a single substrate to provide an economical, high efficiency, planar display. Obviously, edge-emitting superluminescent LEDs used in the past cannot be integrated with other semiconductor devices on the same chip.

Another advantage of superluminescent LEDs which emit light perpendicular to the substrate surface is that they may be assembled easily by direct mounting onto a package surface rather than requiring a difficult "flip" mounting. In addition, testing of the superluminescent LED before separation of the wafer into individual chips is possible. This pre-separation testing avoids the need to mount and package all superluminescent LEDs, of which some may be defective and must then be scrapped. Because packaging costs are a major component of the total superluminescent LED cost, both the ease of assembly and pre-separation testing represent significant manufacturing cost reductions. Furthermore, studies of defect locations on a wafer often provides valuable information which may be used to optimize a wafer manufacturing process. This valuable manufacturing information cannot be obtained if the wafer must be separated into chips before testing.

Superluminescent LEDs operate in a regime between lasing and spontaneous emission. Lasing is undesirable in a superluminescent LED. In the past, there have been difficulties in preventing superluminescent LEDs from lasing within a certain temperature range. In the past, lasing has been prevented by the use of anti-reflective coatings formed on at least one of the facets of an edge-emitting device through which light is emitted. However, driving the superluminescent LEDs to high powers may eventually cause lasing, in spite of the presence of the anti-reflective coating. Because even the best anti-reflective coating will reflect some proportion of the light impinging on it, lasing will eventually occur in the prior art superluminescent LEDs if the power is increased to a high enough level.

Superluminescent LEDs provide high efficiency and freedom from wave interference effects, and superluminescent LEDs which emit light perpendicular to the substrate surface facilitate economical manufacturing, testing, and packaging. There is still a need to fabricate more efficient superluminescent LEDs that do not lase at high power levels and that can be integrated with other devices on the same chip.

SUMMARY OF THE INVENTION

A superluminescent edge emitting device is fabricated to have apparent vertical light emission. The superluminescent device is fabricated to be comprised of a semiconductor supporting structure having a major surface. A light emitting portion is formed above a first portion of the major surface, wherein the light emitting portion is configured in a substantially circular shape to suppress lasing and has sidewalls, and wherein a light is emitted from the sidewalls of the light emitting portion. An non-emitting portion is formed above a second portion of the major surface and adjacent to the light emitting portion, wherein the non-emitting portion has sidewalls, and wherein the sidewalls of the light emitting portion and the sidewalls of the non-emitting portion are configured to direct the light emitted from the light emitting portion substantially perpendicular to the major surface.

DETAILED DESCRIPTION OF THE DRAWINGS

Figure 1:
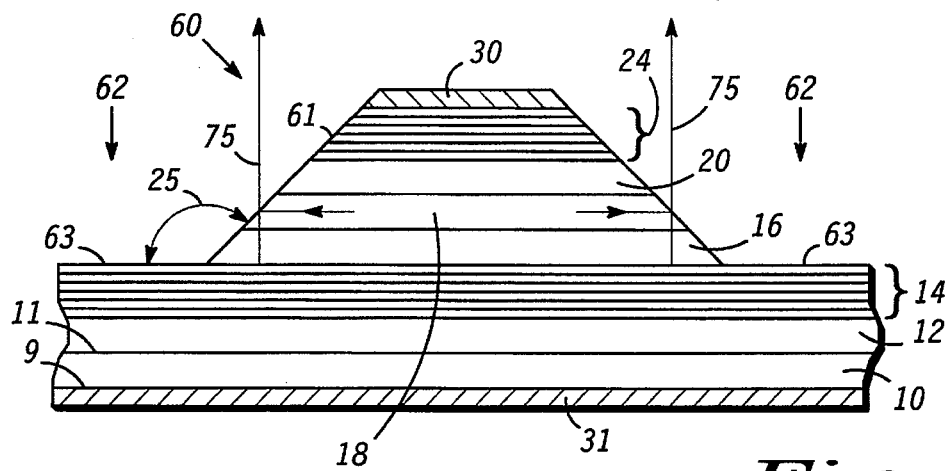
FIG. 1 illustrates an enlarged, cross-sectional view of a superluminescent LED according to a first embodiment of the present invention.

FIG. 1 illustrates a simplified, enlarged cross-section view of a first embodiment of the present invention. What is shown is a superluminescent LED comprised of a supporting structure 10 of a first conductivity type having a first major surface 11 and a second major surface 9. First major surface 11 defines a horizontal plane of the superluminescent LED. In a preferred embodiment, supporting structure 10 is comprised of a semiconductor substrate. More preferably, the semiconductor substrate is comprised of gallium arsenide (GaAs) and is doped n-type with an n-type dopant such as Selenium (Se). Other suitable dopants may be used. An alternative embodiment utilizes a p-type substrate so that first mirror stack 14 may be heavily doped p-type to improve the flow of bias current through the superluminescent LED. Supporting structure 10 and subsequent epitaxial layers formed on supporting structure 10 may be comprised of other III–V semiconductor materials systems such as indium phosphide.

A buffer layer 12 of the first conductivity type serves to smooth the top surface of semiconductor substrate 22. In a preferred embodiment, buffer layer 12 is comprised of a n-type GaAs layer or an aluminum gallium arsenide layer (AlGaAs). Buffer layer 12 is not absolutely necessary to obtain a working device, however, buffer layer 12 may be used to obtain better epitaxial growth of subsequent layers.

Next, a first mirror stack 14 of the first conductivity type is formed on buffer layer 12. First mirror stack 14 is also referred to as a ¼ wave stack or distributed Bragg reflector in the art. First mirror stack 14 is comprised a superlattice structure in which a plurality of alternating layers of semiconductor materials are formed with matching crystal structures. The materials used in first mirror stack 14 must be transparent at the lasing wavelength. In a preferred embodiment, first mirror stack 14 is comprised of alternating layers of n-type aluminum arsenide (AlAs) and n-type GaAs. In addition, the thickness of each layer is preferably equal to ¼ of the wavelength of operation divided by the refractive index. The number of periods or pairs of alternating layers determines the reflectivity of the device.

A bottom cladding layer 16 of the first conductivity type is formed on first mirror stack 14. Bottom cladding layer 16 provides a region having a wide bandgap which serves to confine holes and electrons within an active layer 18 which is formed on bottom cladding layer 16. In a preferred embodiment, bottom cladding layer 16 is comprised of AlGaAs.

Active layer 18 is preferably comprised of barrier layers and at least one light emitting region (quantum well). The light emitting region is preferably comprised of nominally undoped indium gallium arsenide (InGaAs). Multiple light emitting regions may be used. In addition, other materials, such as GaAs, may be used for different operating wavelengths, with appropriate changes to the composition of first mirror stack 14 so that the layers are transparent at the operating wavelength. The formation of light emitting regions and barrier layers is well known in the art. The total thickness of active layer 18 must be a multiple of ½ of the wavelength of operation in order for active layer 18 to fulfill phase matching requirements in the optical cavity, which is comprised of all the layers between first mirror stack 14 and second mirror stack 24 (described below). The light emitting regions which comprise active layer 18 serve to emit light when a bias current is applied to them.

A top cladding layer 20 of a second conductivity type is formed on active layer 18. Top cladding layer 20 is similar in structure and function to bottom cladding layer 16.

Thereafter, a second mirror stack 24 of the second conductivity type is formed on top cladding layer 20. Second mirror stack 24 is typically similar in structure to first mirror stack 14, except that it is of the opposite conductivity type. An alternative embodiment utilizes a dielectric mirror for second mirror stack 24. The dielectric mirror may be comprised of alternating layers of silicon/silicon dioxide (Si/SiO$_2$) or silicon/silicon nitride (Si/SiN$_x$).

A second conductivity type ohmic contact 30 is formed and patterned on second mirror stack 24. The fabrication and use of ohmic contacts, in general, is well known in the art. Ohmic contact 30 is typically comprised of a gold alloy. Ohmic contact 30 serves as a contact means whereby a bias current may be applied to the superluminescent LED and thus applied to active layer 18.

Portions of second mirror stack 24, top cladding layer 20, active layer 18 and bottom cladding layer 16 are etched to form an emitting portion 60 and a non-emitting portion 62. The etch must be performed at least down to first mirror stack 14. Note that non-emitting portion 62 is adjacent to light emitting portion 60.

Sidewalls 61 and 63 are configured to direct the in-plane luminescence substantially perpendicular to major surface 11. In a preferred embodiment, sidewalls 61 and 63 form an oblique or acute angle. FIG. 1 illustrates the first embodiment where emitting portion 60 has sidewalls 61 which are at an angle of approximately 135° from major surface 11 and sidewalls 63 are parallel (or at an angle of 0°) to major surface 11. The angle of 135° is shown by line 25. Isotropic etching to obtain the aforementioned slope of sidewalls 61 can be achieved by a wet etch, dry etch, or by ion milling. Ohmic contact 30 may be used as a mask during this etch if desired. Dry etching can be done by using reactive ion etching (RIE) or reactive ion beam etching (RIBE). RIBE is further described in U.S. Pat. No. 5,116,461, entitled, "A Method for Fabricating an Angled Diffraction Grating," issued to Lebby et al., and assigned to Motorola, Inc., which is hereby incorporated by reference.

Figure 2:
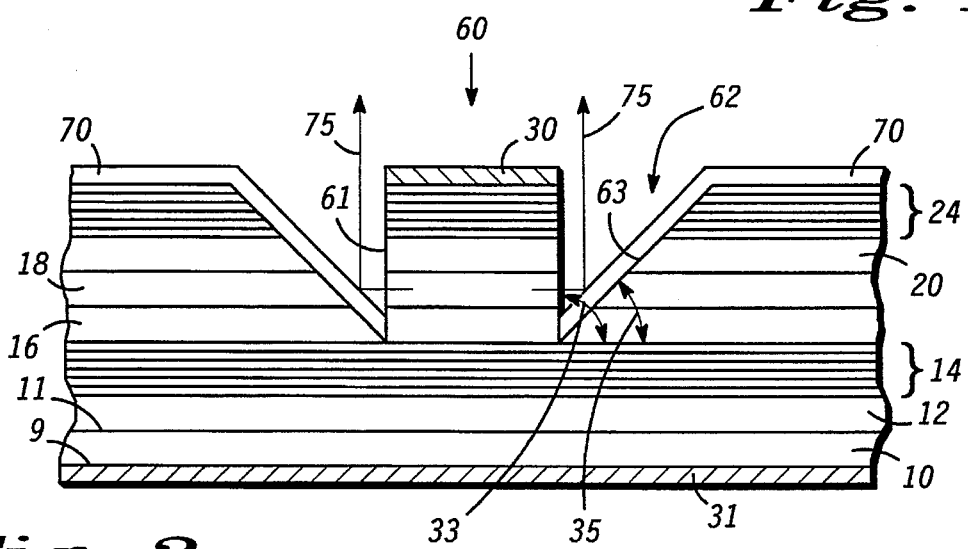
FIG. 2 illustrates an enlarged, cross-sectional view of a superluminescent LED according to a second embodiment of the present invention.

FIG. 2 illustrates a second embodiment where sidewalls 61 are substantially perpendicular (or at an angle of 90°) to major surface 11 and sidewalls 63 at an angle of approximately 45° from major surface 11. The angle of 90° is shown by line 33 and the angle of 45° is shown by line 35. Sidewalls 63 at an angle greater than 0° from major surface 11 and sidewalls 61 at an angle of 90° from major surface 11 can be achieved by RIBE. A combination of the embodiments of FIGS. 1 and 2 would provide a superluminescent LED with sidewalls 61 at an angle of 135° from major surface 11 and sidewalls 63 at an angle of 45° from major surface 11.

Figure 3:
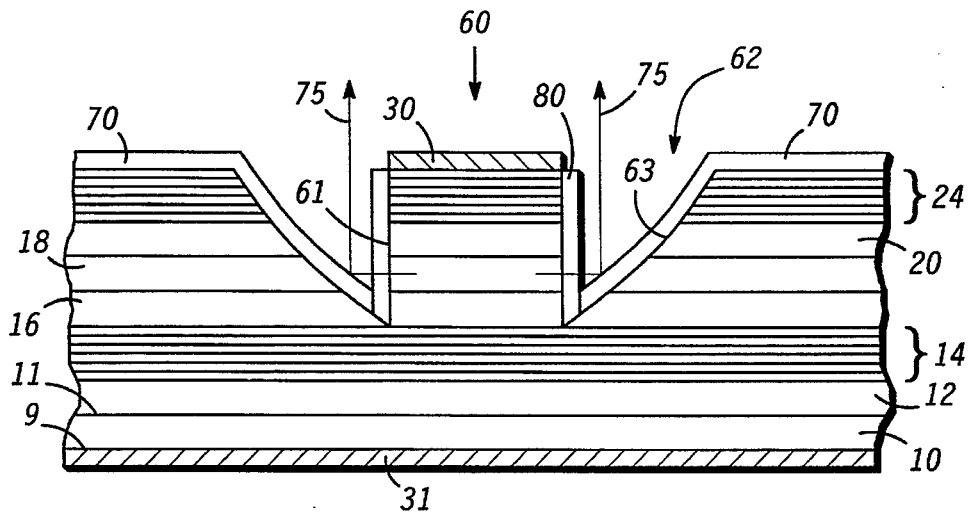
FIG. 3 illustrates an enlarged, cross-sectional view of a superluminescent LED according to a third embodiment of the present invention.

Emission of light takes place in the horizontal direction as shown by emitting light 75 shown in FIGS. 1, 2, and 3. In FIG. 1, light 75 is emitted from emitting portion 60 in a downward direction and reflected off of first mirror stack 14 to be directed substantially perpendicular to major surface 11. The embodiment of FIG. 1 is desirable from the standpoint that it is easily manufactured. However, FIG. 2 illustrates a preferred embodiment of the present invention. The structure of FIG. 2 is preferred because the apparent emission of light 75 substantially perpendicular to major surface 11 is enhanced. In FIG. 2, light 75 is reflected off of sidewalls 63 of non-emitting portion 62 and reflected substantially perpendicular to first major surface 11. FIG. 2 illustrates an embodiment having a reflective layer 70 formed on sidewalls 63. Reflective layer 70 acts to reflect more emitting light 75 substantially perpendicular to major surface 11. Reflective layer 70 is preferably formed at the same time ohmic contact 30 is formed and of the same material as ohmic contact 30. However, other materials may be used. For example, reflective layer 70 may be comprised of a dielectric stack. Reflective layer 70 is not be absolutely necessary to form a working device.

FIG. 3 illustrates an alternate embodiment of the embodiment shown in FIG. 2. This structure is similar to that shown in FIG. 2 except that, in this embodiment, sidewalls 63 are curved to better focus light 75 substantially perpendicular to major surface 11. Curved sidewalls 63 can be formed by RIBE.

This application is related to U.S. Pat. No. 5,034,092, entitled "Plasma Etching of Semiconductor Substrates", by M. Lebby et al., assigned to Motorola, Inc., which is incorporated herein by reference. The layers comprising the structure of the present invention is superficially similar to those of the vertical cavity surface emitting laser (VCSEL) which is described in the cited patent.

In the laser device described by the cited patent the reflectivities of the first and the second mirror stacks are chosen to be nearly 100% so as to achieve lasing in the vertical direction. By contrast, in a superluminescent LED of the present invention, the reflectivities are chosen to be less than 100% because lasing is undesirable. The first and second mirror stacks 16 and 20 of the present invention are fabricated to enhance superluminescent behavior by confining emitted photons to the plane of active layer 18 (also referred to as the gain region).

Superluminescent operation horizontal to the plane of major surface 11 is favored because of the longer optical path length for photons propagating in the horizontal plane. The reduced mirror stack reflectivities suppress lasing or strongly superluminescent operation vertical to the plane of major surface 11.

Figure 4:
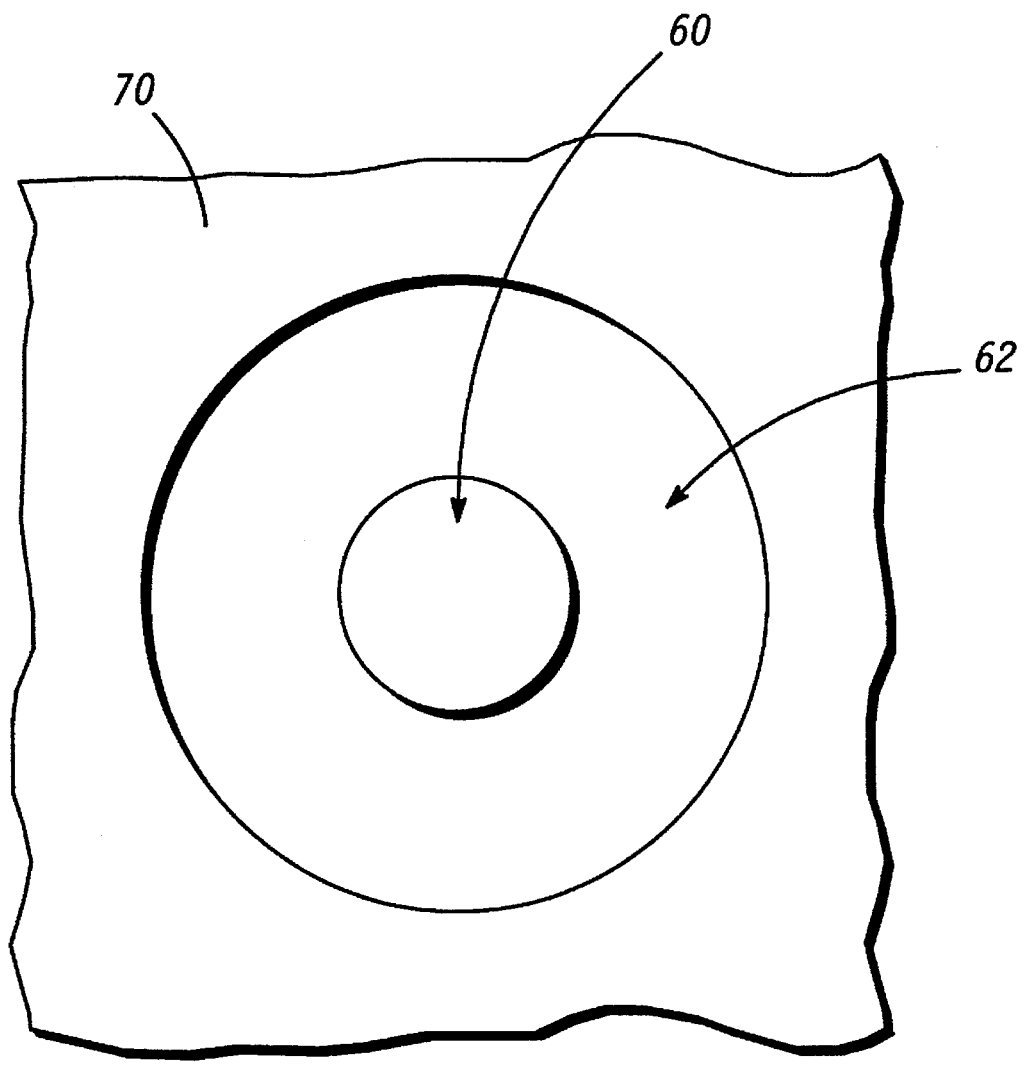
FIG. 4 illustrates an enlarged, top view of the second embodiment of the present invention.

FIG. 4 illustrates an enlarged, highly simplified top view of the embodiment shown in FIG. 2. The superluminescent LED of the present invention is preferably configured so that lasing is suppressed. In a preferred embodiment, the configuration of emitting portion 60 of the superluminescent LED is substantially circular. Lasing in the plane horizontal to major surface 11 is suppressed because of the circular shape of light emitting portion 60, which corresponds to a resonator configuration that is not stable. The circle is preferably 2–20 micrometers in diameter measured in active layer 18. If the circle is too large, lasing may take place. If the circle is too small, superluminescent emission may be reduced. Substantially circular means that the configuration of active portion 60 can be a polygon which is substantially circular. In addition, other methods to suppress lasing can also be used. For example, an anti-reflective coating 80 (shown in FIG. 3) may be formed on sidewalls 61 to further suppress lasing. This anti-reflective coating 80 may be comprised of silicon nitride or other suitable materials. The formation of anti-reflective coatings, in general, is well known in the art.

To complete the formation of the superluminescent LED, a first conductivity type ohmic contact 31 is formed on second major surface 9 of supporting structure 10, as is shown in FIGS. 1, 2, and 3.

By now it should be clear that the superluminescent LED provided by this invention combines the advantages of superluminescence with the advantages of surface emitting devices. Although a true surface emitting device is not fabricated, the superluminescent LED of the present invention emits light substantially perpendicular to major surface 11. Like a surface emitting device, the superluminescent LED of the present invention is easy to build, package and test. The superluminescent LED of the present invention may be easily fabricated as part of a large array of such superluminescent LEDs or as part of a larger integrated circuit.

We claim:

1. A superluminescent light emitting device, comprising:
   a semiconductor supporting structure comprised of a first mirror stack comprised of a plurality of layers of semiconductor materials having matching crystal structures having a major surface;
   a light emitting portion formed above a first portion of the major surface, wherein the light emitting portion is comprised of an active layer comprised of at least one light emitting region formed above a portion of the first mirror stack and a second mirror stack comprised of a plurality of layers of semiconductor materials having matching crystal structures formed above the active layer, and is configured in a substantially circular shape to suppress lasing and has sidewalls, and wherein a light is emitted from the sidewalls of the light emitting portion;
   a non-emitting portion formed above a second portion of the major surface and adjacent to the light emitting portion, wherein the non-emitting portion has sidewalls, and wherein the sidewalls of the light emitting portion and the sidewalls of the non-emitting portion are configured to direct the light emitted from the light emitting portion substantially perpendicular to the major surface.

2. The superluminescent light emitting device of claim 1, wherein the sidewalls of the light emitting portion and the sidewalls of the non-emitting portion form an acute angle.

3. The superluminescent light emitting device of claim 1, wherein the sidewalls of the light emitting portion and the sidewalls of the non-emitting portion form an oblique angle.

4. The superluminescent light emitting device of claim 1, wherein the sidewalls of the non-emitting portion are at an angle of approximately 0° from the major surface and the sidewalls of the light emitting portion at an angle of approximately 135° from the major surface.

5. The superluminescent light emitting device of claim 1, wherein the sidewalls of the light emitting portion are at an angle of approximately 135° from the major surface and the sidewalls of the non-emitting portion are at an angle of approximately 45° from the major surface.

6. The superluminescent light emitting device of claim 1, wherein the sidewalls of the light emitting portion are at an angle of approximately 90° and the sidewalls of the non-emitting portion are at an angle of approximately 45° from the major surface.

7. The superluminescent light emitting device of claim 1, further comprised of a reflective layer formed on the sidewalls of the non-emitting portion.

8. The superluminescent light emitting device of claim 7, wherein the reflective layer is comprised of a dielectric stack.

9. The superluminescent light emitting device of claim 1, further comprising an anti-reflective layer formed on the sidewalls of the light emitting portion.

10. The superluminescent light emitting device of claim 1, wherein the sidewalls of the non-emitting portion are curved to better focus the light substantially perpendicular to the major surface.

11. The superluminescent light emitting device of claim 1 wherein the first mirror stack and the second mirror stack are comprised of aluminum arsenide and gallium arsenide.

12. The superluminescent light emitting device of claim 1, wherein the semiconductor supporting structure is comprised of n-type gallium arsenide.

13. The superluminescent light emitting device of claim 1, wherein the light emitting portion is approximately 2–20 microns in diameter.

14. A superluminescent light emitting device, comprising:
   a semiconductor supporting structure having a major surface;
   a light emitting portion having sidewalls and a substantially circular configuration to suppress lasing formed above a portion of the semiconductor supporting structure, wherein the light emitting portion is comprised of a first mirror stack comprised of a plurality of layers of semiconductor materials having matching crystal structures, an active layer comprised of at least one light emitting region, and a second mirror stack comprised of a plurality of layers of semiconductor materials having matching crystal structures, formed above the active layer, wherein the combined reflectivities of the first and second mirror stacks are selected such that a light is emitted in the superluminescent operating mode from the sidewall of the active layer; and a non-emitting portion having sidewalls formed on the semiconductor supporting structure, wherein the sidewalls of the light emitting portion and the sidewalls of the non-emitting portion are configured to direct the light emitted from the light emitting portion substantially perpendicular to the major surface.

15. The superluminescent light emitting device of claim 14, wherein the sidewalls of the light emitting portion and the sidewalls of the non-emitting portion form an acute angle.

16. The superluminescent light emitting device of claim 14, wherein the sidewalls of the light emitting portion and the sidewalls of the non-emitting portion form an oblique angle.

17. The superluminescent light emitting device of claim 14, wherein the sidewalls of the non-emitting portion are at an angle of approximately 0° from the major surface and the sidewalls of the light emitting portion at an angle of approximately 135° from the major surface.

18. The superluminescent light emitting device of claim 14, wherein the sidewalls of the light emitting portion are at an angle of approximately 135° from the major surface and the sidewalls of the non-emitting portion are at an angle of approximately 45° from the major surface.

19. The superluminescent light emitting device of claim 14, wherein the sidewalls of the light emitting portion are at an angle of approximately 90° and the sidewalls of the non-emitting portion are at an angle of approximately 45° from the major surface.

20. The superluminescent light emitting device of claim 14, further comprised of a reflective layer formed on the sidewalls of the non-emitting portion.

21. The superluminescent light emitting device of claim 20, wherein the reflective layer is comprised of a dielectric stack.

22. The superluminescent light emitting device of claim 14, further comprising an anti-reflective layer formed on the sidewalls of the light emitting portion.

23. The superluminescent light emitting device of claim 14, wherein the sidewalls of the non-emitting portion are curved to better focus the light substantially perpendicular to the major surface.

24. The superluminescent light emitting device of claim 14, wherein the semiconductor supporting structure is comprised of n-type gallium arsenide.

25. The superluminescent light emitting device of claim 14, wherein the light emitting portion is approximately 2–20 microns in diameter.

* * * * *